(12) United States Patent
Suzuki

(10) Patent No.: US 7,422,780 B2
(45) Date of Patent: Sep. 9, 2008

(54) ENVIRONMENTALLY FRIENDLY PLASTIC CONTAINER

(75) Inventor: Masato Suzuki, Isehara (JP)

(73) Assignee: Yoshino Kogyosho Co., Ltd., Tokyo (JP)

( * ) Notice: Subject to any disclaimer, the term of this patent is extended or adjusted under 35 U.S.C. 154(b) by 519 days.

(21) Appl. No.: 10/518,458

(22) PCT Filed: Jun. 27, 2002

(86) PCT No.: PCT/JP02/06515

§ 371 (c)(1),
(2), (4) Date: Jul. 5, 2005

(87) PCT Pub. No.: WO2004/002836

PCT Pub. Date: Jan. 8, 2004

(65) Prior Publication Data

US 2005/0271846 A1     Dec. 8, 2005

(30) Foreign Application Priority Data

Mar. 16, 2001   (JP)   .............................. 2001-075643

(51) Int. Cl.
*B29D 22/00*    (2006.01)
*B29D 23/00*    (2006.01)
*B32B 1/08*     (2006.01)
*B32B 9/00*     (2006.01)
*B65D 85/84*    (2006.01)

(52) U.S. Cl. ..................... 428/35.7; 428/36.6; 428/408; 220/DIG. 30; 206/524.7

(58) Field of Classification Search ................ 428/35.2, 428/35.7, 36.6, 34.1, 408; 220/DIG. 30; 206/524.7
See application file for complete search history.

(56) References Cited

U.S. PATENT DOCUMENTS 3,844,987 A    10/1974   Clendinning et al.

FOREIGN PATENT DOCUMENTS

| JP | A 08-058796  | 3/1996  |
|----|--------------|---------|
| JP | A-10-034807  | 2/1998  |
| JP | A-2000-118920| 4/2000  |
| JP | A-2001-018290| 1/2001  |
| JP | A-2001-354223| 12/2001 |
| JP | A-2002-068201| 3/2002  |

*Primary Examiner*—Michael C Miggins
(74) *Attorney, Agent, or Firm*—Oliff & Berridge, PLC

(57) ABSTRACT

An environmentally friendly plastic container that can be subjected to waste disposal with ease is proposed. The container is obtained by blow-molding a hollow preform, and the container itself is formed of a biodegradable plastic material.

1 Claim, 2 Drawing Sheets

ENVIRONMENTALLY FRIENDLY PLASTIC CONTAINER

BACKGROUND OF THE INVENTION

1. Technical Field

The present invention relates to environmentally friendly plastic container intended to stably maintain the quality of the contents and capable of being subjected to waste disposal with ease after use without adversely affecting the natural environment.

2. Background Art

Since plastic containers are light-weight in comparison to glass or metal containers, and can be molded easily at low cost, they are widely used in various fields as containers for packaging or filling food, drink, medicament, or detergent in recent years.

There are types of plastic that is difficult to burn when discarding because they generate harmful gas such as dioxin, or may give damage to the wall of incinerators since their calorific value is high. Thus, in order to recycle such types of plastic container, they are reused as fibers for garments or part of components of building material. However, the range of application is not yet extended.

It is also difficult to maintain the quality of contents stably because many types of plastic material have characteristics that allow gas, such as oxygen, to pass through, or absorb aromatic odor, whereby improvements are required for some types of containers.

DISCLOSURE OF THE INVENTION

It is an object of the present invention to provide a novel plastic container that can be subjected to waste disposal after use, with ease and without affecting environment.

The present invention provides an environmentally friendly plastic container obtained by blow-molding a hollow pre-molded body, wherein the container comprises a container main body that is comprised of a biodegradable plastic material.

It is preferred that the container having the above-mentioned structural feature includes a coating layer that prevents passage of gas or water on at least inner surface of the main body thereof.

It is preferred to provide a coating layer of deposited film of materials such as diamond-like carbon (DLC), $SiO_2$, SiC or.

The biodegradable plastic material that can be applied may comprise microbial polymer, chemical synthetic polymer, polylactic/chemical synthetic polymer, or naturally occurring polymer.

BRIEF DESCRIPTION OF THE DRAWINGS

Referring now to the drawings, the present invention will be described in detail.

BEST MODE FOR CARRYING OUT THE INVENTION

Figure 1:
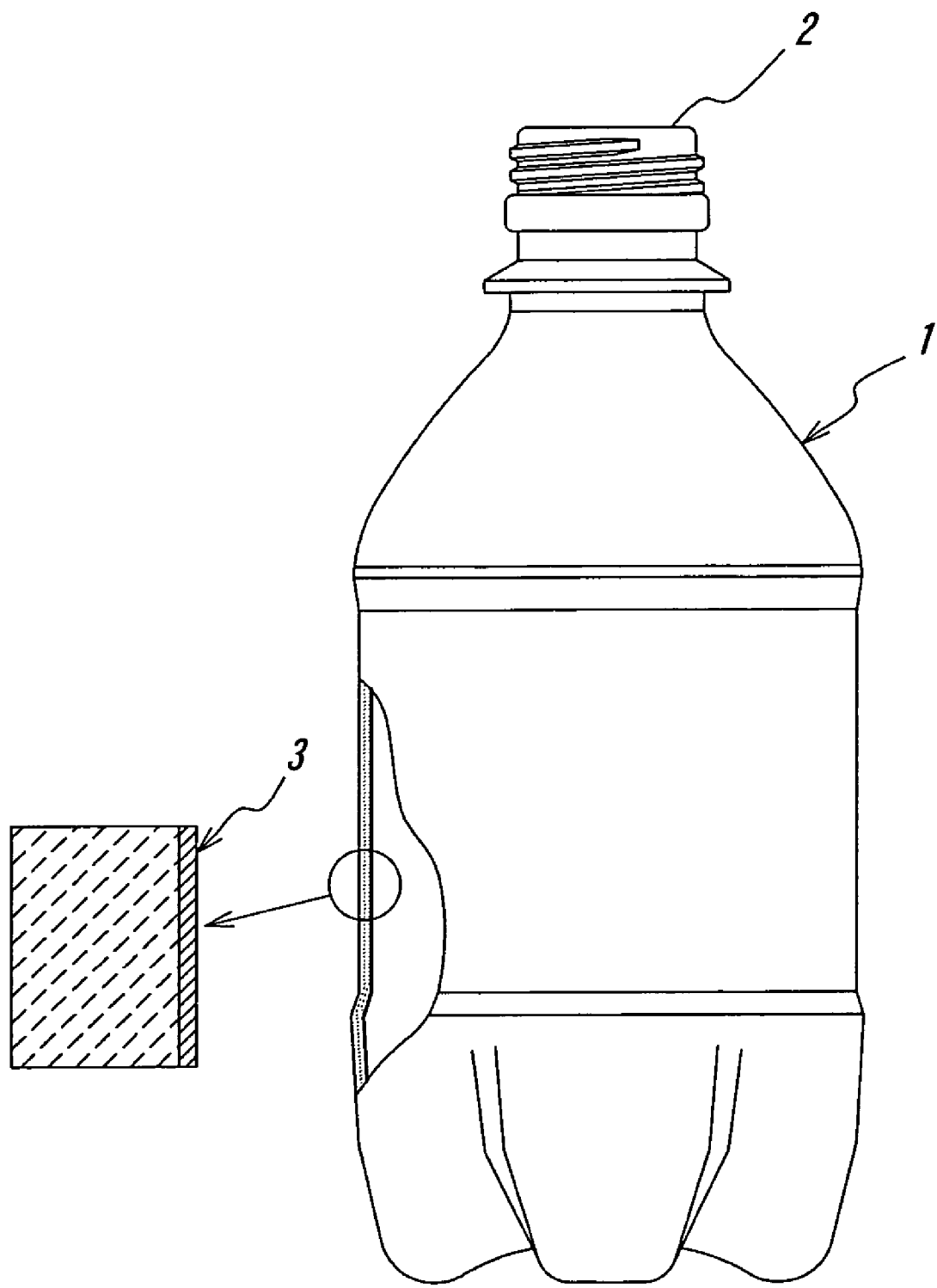
FIG. 1 is an overview of a plastic container according to the present invention.

FIG. 1 shows a structure of a bottle-shaped plastic container according to the present invention.

In the drawing, reference numeral 1 denotes a container main body formed of a biodegradable plastic material, reference 2 denotes a mouth of the container, and reference numeral 3 denotes a coating layer formed on the inner surface of the container body 1 in one example.

Figure 2:
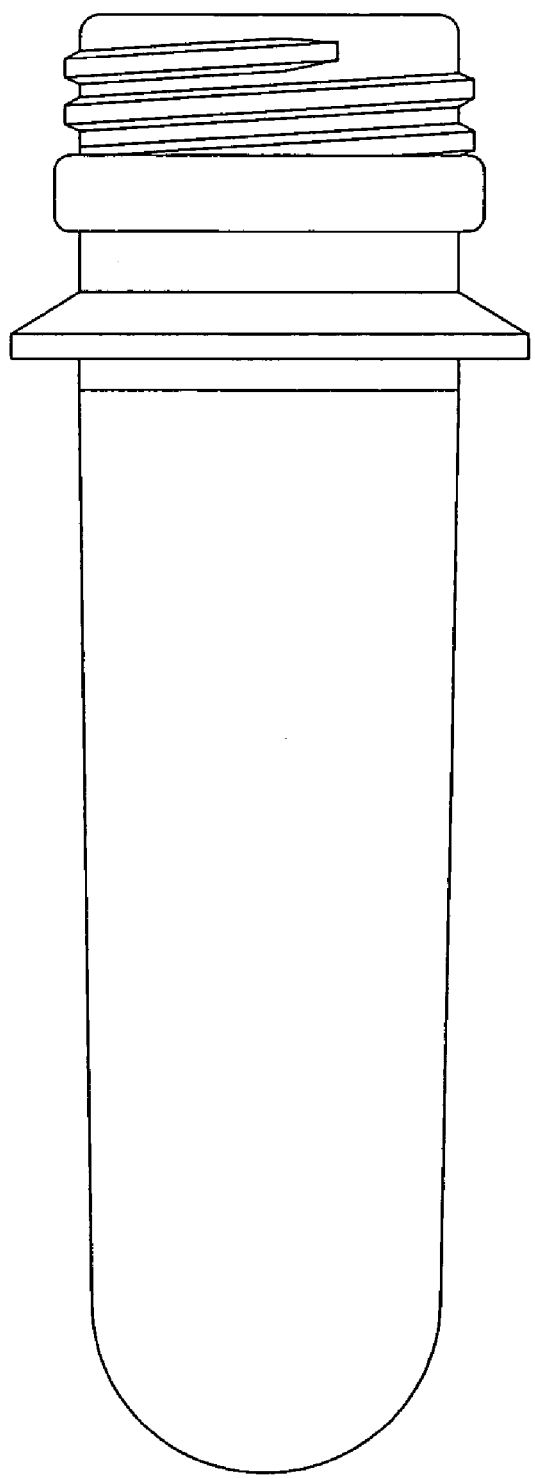
FIG. 2 is an overview of a preform.

In order to fabricate the container configured as described above, a hollow preform such as that shown in FIG. 2 is molded by extrusion or injection process, and then finished into a container which has a desired appearance by blow molding such as direct blow molding, biaxial stretching blow molding, etc. Then, a coating layer for preventing passage of gas or permeation of water is formed on the inner surface of the container using a depositing technology in a conventional manner, in accordance with the intended application of the container.

Since plastic materials have characteristics that allow passage of low molecular gas such as oxygen or carbon dioxide, when oxygen or the like is passed through the body portion of the container, the quality of contents may be affected. However, by the provision of the coating layer 3, barrier properties of the container can be improved, whereby the quality of the contents can be maintained stably.

The biodegradable plastic material which may be applied includes microbial polymer such as hydroxybutyrate-co-valerate (PHB/V), or maltotriose, chemical synthetic polymer such as polybutylene succinate (PBS), Polybutylene succinate adipate (PBSA), Polybutylene succinate carbonate, Polycaprolactone (PCL), Cellulose acetate (PH), Aromatic/aliphatic copolyesters, or modified PET, polylactic/chemical synthetic polymer such as polylactic polymer (PLA) or copoly-L-lactide(CPLA), and naturally occurring polymer, such as starch+modified PVA+aliphatic polyester, or corn starch.

Since the biodegradable plastic material is degraded by reaction with $O_2$ or $O_3$, photochemical reaction, hydrolysis, or by microorganism, it is broken down (degraded) without applying human action such as burning. On this occasion, thin films such as DLC or $SiO_2$ go back to natural world together with break down of plastic material.

As regards the coating layer that improves the barrier properties, the case in which the thin film such as DLC or $SiO_2$ is applied has been described. However, the present invention is not limited thereto as long as it does not hinder degradation of plastic material.

By the provision of the coating layer, the amount of elution of acetaldehyde is constrained, and aroma retention of the contents is improved. In particular, when DLC is employed, the container itself can be made opaque, and hence there is an advantage in that light-blocking effect can be improved.

Material such as SiC or SiN are also applicable to the present invention as the coating layer. The preferred thickness will be on the order of 0.01 to 0.2 μm in any cases. Although the coating layer in FIG. 1 is formed on the inner surface, the present invention is not limited thereto, and may be formed on the outer surface.

Table 1 shows a result of investigation relating to degradability of biodegradable plastic material. In the table, symbol ◎ represents "excellent", symbol ○ represents "good", and symbol Δ represents "acceptable".

TABLE 1

| Type | Microbial PHB/V | Chemical Synthetic PCL | Chemical Synthetic PBSA | Chemical Synthetic PBS | Polylactic PLA |
|---|---|---|---|---|---|
| active sludge | ◎ | ◎ | ◎ | Δ | Δ |
| compost | ◎ | ◎ | ◎ | ◎ | ◎ |
| earth | ◎ | ◎ | ◎ | ○ | Δ |
| fresh water | ◎ | ◎ | ◎ | ◎ | Δ |
| sea water | ◎ | ◎ | ◎ | ○ | Δ |

Table 2 shows a result of comparison relating to improvement effect of $O_2$ barrier properties of PLA (polylactic) bottle having 500 ml capacity between the case where various thicknesses of DLC deposited film are formed on the inner surface thereof and the case where $SiO_x$ deposited film is formed on the outer surface thereof. The film thicknesses shown here are values obtained by measuring with an atomic force microscope (AFM)(TOPOMETRIX Explorer 2100-type Scanning Probe Microscope) after masking on one point of the container body.

TABLE 2

| NO. | Penetration Amount of Oxygen (cc/day/bottle) | Improvement Rate | Remarks |
| --- | --- | --- | --- |
| 1 | 0.45 | 1 | simple PLA |
| 2 | 0.266 | ×1.7 | DLC film thickness 150 angstrom (0.015 μm) |
| 3 | 0.220 | ×2.0 | DLC film thickness 230 angstrom (0.023 μm) |
| 4 | 0.192 | ×2.3 | DLC film thickness 470 angstrom (0.047 μm) |
| 5 | 0.370 | ×1.2 | $SiO_x$ film thickness 400 angstrom (0.040 μm) |

It can be appreciated from Table 2, that penetration of oxygen is extremely low in the bottles on which the DLC deposited film or $SiO_x$ deposited film are formed in comparison with the simple PLA bottle.

INDUSTRIAL APPLICABILITY

According to the present invention, not only the quality of the contents can be maintained stably, but also the bottle can be degraded naturally without application of human action when discarded. Therefore, the present invention is extremely effective for the preservation of environment.

The invention claimed is:

1. An environmentally friendly plastic container obtained by blow-molding a hollow preform, wherein the container comprises,
    a container main body comprised of a biodegradable plastic material, wherein the biodegradable plastic material comprises polylactic/chemical synthetic polymer; and
    a coating layer, that prevents passage of gas or permeation of water, on at least the inner surface of the container main body, wherein the coating layer comprises a deposited film of diamond-like carbon (DLC).

* * * * *